(12) United States Patent
Shimizu

(10) Patent No.: US 8,580,662 B2
(45) Date of Patent: Nov. 12, 2013

(54) MANUFACTURE METHOD OF A SPLIT GATE NONVOLATILE MEMORY CELL

(75) Inventor: Masakuni Shimizu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 115 days.

(21) Appl. No.: 13/269,092

(22) Filed: Oct. 7, 2011

(65) Prior Publication Data

US 2012/0028424 A1 Feb. 2, 2012

Related U.S. Application Data

(63) Continuation of application No. 11/889,657, filed on Aug. 15, 2007, now abandoned.

(30) Foreign Application Priority Data

Aug. 17, 2006 (JP) ................................ 2006-222323

(51) Int. Cl.
*H01L 21/425* (2006.01)
(52) U.S. Cl.
USPC ........... 438/514; 438/157; 438/163; 438/257; 257/E21.179; 257/E21.337; 257/E21.422
(58) Field of Classification Search
USPC ......... 438/142, 157, 161, 163, 197, 201, 211, 438/257, 262, 301, 514, 526, 923; 257/E21.135, E21.148, E21.179, 257/E21.248, E21.334, E21.337, E21.342, 257/E21.422
See application file for complete search history.

(56) References Cited

U.S. PATENT DOCUMENTS

| | | | |
|---|---|---|---|
| 5,313,421 A | 5/1994 | Guterman et al. | |
| 5,776,810 A | 7/1998 | Guterman et al. | |
| 5,847,996 A | 12/1998 | Guterman et al. | |
| 5,910,915 A | 6/1999 | Guterman et al. | |
| 5,910,925 A | 6/1999 | Guterman et al. | |
| 5,939,749 A | 8/1999 | Taketa et al. | |
| 6,051,860 A * | 4/2000 | Odanaka et al. | 257/316 |
| 6,165,847 A | 12/2000 | Kanamori | |
| 6,525,371 B2 | 2/2003 | Johnson et al. | |

FOREIGN PATENT DOCUMENTS

| | | |
|---|---|---|
| JP | 8-500937 A | 1/1996 |
| JP | 9-092734 | 4/1997 |
| JP | 10-173078 A | 6/1998 |
| JP | 2001-127179 A | 5/2001 |

* cited by examiner

*Primary Examiner* — Eduardo A Rodela
(74) *Attorney, Agent, or Firm* — Foley & Lardner LLP

(57) ABSTRACT

A split gate nonvolatile memory cell is provided with a first diffusion region, a second diffusion region, and a channel region formed between the first and second diffusion regions, including a first channel region having a predetermined dopant concentration. The first channel region is positioned apart from the first and second diffusion regions.

6 Claims, 20 Drawing Sheets

PROGRAMMING

ERASURE

READ

MANUFACTURE METHOD OF A SPLIT GATE NONVOLATILE MEMORY CELL

CROSS-REFERENCE TO RELATED PATENT APPLICATIONS

This application is a continuation of application Ser. No. 11/889,657, filed Aug. 15, 2007, now abandoned, which claims the benefit of priority from the prior Japanese Patent Application No. 2006-222323, filed Aug. 17, 2006, the entire contents of which are incorporated herein by reference. This application claims only subject matter disclosed in the parent application and therefore presents no new matter.

BACKGROUND OF THE INVENTION

1. Field of the Invention

The present invention relates to a nonvolatile semiconductor memory device, and especially relates to a structure and manufacturing method of a split gate nonvolatile memory.

2. Description of the Related Art

The floating gate memory, which incorporates floating gate transistors as memory cells, is a sort of nonvolatile semiconductor memory devices which store data even when the power supply is shut off. Programming data in to the cell is achieved by injecting electric charges into the floating gate, and erasing data is achieved by pulling electric charges off the floating gate. Data program operation causes an increase in the threshold voltage of the floating-gate transistor cell and prevents a drain current from flowing through the floating-gate transistor in read operation. Data erase operation causes a decrease in the threshold voltage of the floating-gate transistor cell, and allows a drain current to flow through the floating-gate transistor in reading operation.

Data erase operation must be implemented so that the threshold voltage of the cell is kept in a predetermined range. When the threshold voltage of the cell is excessively reduced due to "over erasing", the operation of the floating-gate nonvolatile memory may suffer from unstable operation, because the drain current may flow through the cell even when the read voltage is not applied to the control gate.

The split gate nonvolatile memory is known as a floating-gate nonvolatile memory which effectively avoids the problem resulting from the over erasing, as disclosed in Japanese Laid-Open Patent Application No. Jp-A Heisei 9-92734 (hereinafter, the '734 application).

FIG. 1 is a cross section view showing the structure of a typical split gate nonvolatile memory 101. In the conventional split gate nonvolatile memory 101, a first diffusion region 103 and a second diffusion region 104 are formed within a substrate 102.

The first diffusion region 103 is used as a drain in program operation, while used as a source in read operation. The second diffusion region 104, on the other hand, is used as a source in program operation, while used as a drain in read operations. A channel region 110, in which a channel is formed, is provided between the first and second diffusion regions 103 and 104. In the split gate nonvolatile memory 101, a floating gate 106 is opposed to only a part of the channel region 110 (referred to as the first channel region 110a, hereinafter), and a control gate 108 is opposed to another part of the channel region (referred to as the second channel region 110b, hereinafter), differently from a stack gate nonvolatile memory cell. The floating gate 106 and the first channel region 110a function as a memory transistor, while the control gate 108 and the second channel region 110b functions as a selection transistor.

As described above, the channel region 110 includes the first and second channel regions 110a and 110b. The first channel region 110a is positioned under the floating gate 106 across a gate oxide film 105. The second channel region 110b is positioned under the control gate 108 across a tunnel oxide film 107. In addition, the tunnel oxide film 107 is formed so as to cover the upper and side faces of the floating gate 106, and the control gate 108 is formed to cover the floating gate 106 across the tunnel oxide film 107. In other words, the control gate 108 is opposed to the side and upper faces of the floating gate 106 across the tunnel oxide film 107.

A channel is formed within the first channel region 110a under the floating gate 106 in accordance with the voltage applied to the control gate 108 and the amount of charges accumulated in the floating gate 106. In the similar way, a channel is formed within the second channel region 110b in accordance with the voltage applied to the control gate 108.

Various techniques are known for erasing data in a memory cell within the conventional split gate nonvolatile memory. One known technique involves flowing an FN (Fowler-Nordheim) tunnel current from the control gate to the floating gate to thereby pull electric charges from the floating gate to the control gate. One advantage of the split gate nonvolatile memory is that the channel can be turned off by controlling the control gate, even when electric charges are excessively pulled off the floating gate (that is, even when over erasing occurs). The split gate nonvolatile memory effectively avoids the problem that the drain current may flow through the cell even when the read voltage is not applied to the cell.

Another advantage is that the split gate nonvolatile memory is adapted to the source side injection (SSI), due to the structure in which the control gate is laterally positioned adjacent to the floating gate. The source side injection is superior in the injection efficiency of channel hot electrons to the conventional channel hot electron injection from the drain side (often referred to as the drain side injection), achieving high speed program operation.

FIGS. 2A to 2C are cross section views showing an exemplary operation of the above-mentioned split gate nonvolatile memory 101. FIG. 2A shows an exemplary write operation of the split gate nonvolatile memory 101, and FIG. 2B shows an exemplary erase operation. Finally, FIG. 2C shows an exemplary read operation of the split gate nonvolatile memory 101. Referring to FIG. 2A, the first diffusion region 103 is used as the drain and pulled up to a voltage higher than that of the second diffusion region 104, which is used as the source, when data program operation is performed in the split gate nonvolatile memory 101. This causes generation of hot electrons (electrons with high energy) in the source-side portion of the channel under the floating gate 106 and data is programmed into the cell by injecting the hot electrons into the floating gate 106 through the gate oxide film 105. The floating gate 106 is negatively charged after the write operation.

Referring to FIG. 2B, data erase operation is performed by pulling electrons from the floating gate 106 to the control gate 108 through the tunnel oxide film 107 by using tunneling. The floating gate 106 is positively charged after the erase operation.

Referring to FIG. 2C, a predetermined read voltage is applied to the control gate 108 to activate the memory transistor, when data read operation is performed in the split gate nonvolatile memory 101. The source-drain current varies depending on the amount of electrons injected into the floating gate 106, and the data stored in the cell is identified from the source-drain current.

The threshold voltage of the cell is dependent on the dopant concentration of the channel region 110. When the dopant concentration of the channel region 110 is excessively high, the threshold voltage of the selection transistor within the cell is excessively increased, resulting in the reduced current drive ability of the selection transistor. This may cause a problem in read operation. When the dopant concentration of the channel region 110 is excessively low, this may cause reduced efficiency in program operation. The low dopant concentration of the channel region 110 implies that the dopant concentration of the portion of the channel region 110 opposed to the spacing between the floating gate 106 and the control gate 108. This causes the decrease in the electric field strength at the spacing portion in program operation.

The '734 application also discloses the dopant implantation into the channel region 110. FIG. 3A to 3C illustrates the process of the dopant implantation disclosed in the '734 application. As shown in FIG. 3A, the disclosed dopant implantation process begins with implanting P-type dopants (such as boron) into a surface portion of a substrate 102 with a predetermined dopant concentration. A first polysilicon film 111 is then deposited to cover the entire structure through a CVD method.

As shown in FIG. 3B, a resist 121 is then formed on the first polysilicon film 111. This is followed by removing a portion of the first polysilicon film 111 with the resist 121 used as a mask to thereby form an opening exposing a target region of the substrate 102. The region of the substrate 102 which remains covered with the first polysilicon film 111 is used as the first channel region 110a. N-type dopants (such as phosphorus) are then implanted into the substrate 102 through the opening to achieve counter-ion implantation. The N-type dopants are implanted so as not to convert the conductivity type of the target region of the substrate 102 from P-type to N-type. The target region, into which the N-type dopants are implanted, has a reduced effective P-type dopant concentration and is used as the second channel region 110b.

This is followed by forming an oxide film 107, as shown in FIG. 3C. Subsequently, as shown in FIG. 3D, a second polysilicon film 112 is deposited to cover entire structure by using a CVD method.

As describe above, the disclosed dopant implantation process uses a counter-dopant implantation technique to form the first and second channel regions 110a and 110b so that the first and second channel regions 110a and 110b have different dopant concentrations. This achieves increasing the electric field at the vicinity of the first diffusion region 103 in program operation and improving the current drive ability in read operation.

U.S. Pat. No. 6,525,371 discloses a split gate nonvolatile memory having a configuration different from that of the above mentioned split gate nonvolatile memory 101. FIG. 4 is a cross section view showing the structure of the disclosed split gate nonvolatile memory device, which is referred to as the split gate nonvolatile memory 201, hereinafter. The split gate nonvolatile memory 201 includes first and second diffusion regions 203 and 204 formed within a substrate 202. The split gate nonvolatile memory 201 additionally includes a floating gate 205 and a control gate 206. The floating gate 205 is positioned over the substrate 202 across a gate oxide film 207. The control gate 206 is positioned over the substrate 202 across a tunnel oxide film 208. The tunnel oxide film 208 extends to the space between the floating gate 205 and the control gate 206.

One of the recent requirements imposed on the split gate nonvolatile memory is higher storage capacity, and therefore, cell size reduction is strongly required. One possible approach is reduction in the gate length of the transistor within the memory cell. For the split-gate nonvolatile memory, the gate length of the floating gate is desired to be reduced.

However, the reduction of the floating gate length may cause severe short channel effect and punch through. The excessive reduction in the floating gate length may cause an excessive decrease in the threshold voltage of the memory transistor, due to the short channel effect. Additionally, the excessive reduction in the floating gate length may result in that the source-side depletion layer reaches the drain-side depletion layer and may make the current through the memory cell uncontrollable.

FIG. 5 is a cross section view that schematically illustrates write operation of the memory cell with an excessively-short floating gate length in the sprit-gate nonvolatile memory 201. Due to the excessively-short floating gate length, the source-side depletion layer may be expanded to cause punch through in write operation, during which a high voltage is applied to the first diffusion layer 203.

When a source-side injection technique is used to inject electrons into the floating gate during program operation, the sprit gate nonvolatile memory 201 requires concentrating an electric field into the substrate portion opposed to the spacing between the floating gate 205 and the control gate 206 in order to generate a desired amount of hot electrons; however, punch through undesirably prevents concentration of the electric field into the desired substrate portion, and interferes the generation of a desired amount of channel hot electrons. As a result, the punch through may cause reduction of the programming efficiency or failure of program operation.

Increase in the dopant concentration in the substrate under the floating gate may effectively suppress the punch through, resulting in successfully injecting a desired amount of hot electrons into the floating gate of a selected cell; however, the increase in the dopant concentration under the floating gate may cause Avalanche breakdown, reducing the withstand voltage of the PN junction formed between the substrate and the diffusion regions 203 and 204. The increase in the dopant concentration in the substrate reduces the width of the depletion layer between the diffusion region and the substrate. An Avalanche breakdown may occur, when a high reverse voltage is applied to a PN junction with a reduced depletion layer width.

Another issue is that the increase in the dopant concentration may also cause undesirable programming of an unselected cell in program operation. In program operation, a high voltage is to be applied to the source of a selected memory cell. This causes that the high voltage is also applied to sources of unselected memory cells, because one source is usually shared by multiple cells in a sprit gate nonvolatile memory.

FIG. 6 illustrates the operation of an unselected cell in program operation. A high voltage is fed to the first diffusion region 203 of the unselected cell to reversely bias the PN junction between the substrate 202 and the first diffusion region 203. Due to the decrease in the breakdown voltage of the PN junction resulting from the increase in the dopant concentration of the substrate, the junction leak current is increased between the substrate 202 and the first diffusion region 203 and this enhances the generation of hot electrons. The generated hot electrons are injected into the floating gate 205, jumping over the energy barrier of the gate oxide film 207, by the potential difference between the floating gate 205 and the substrate 202. Such phenomenon is often referred to as the substrate hot electron injection. As thus described, the split gate nonvolatile memory suffers from the substrate hot electron injection into the floating gate 205 of the unselected cell which causes undesirable programming of the unselected cell, when the dopant concentration of the substrate is excessively increased in the portion near the first diffusion region 203.

SUMMARY

In an aspect of the present invention, a split gate nonvolatile memory cell is provided with a first diffusion region, a second diffusion region, and a channel region formed between the first and second diffusion regions, including a first channel region having a predetermined dopant concentration. The first channel region is positioned apart from the first and second diffusion regions.

Preferably, the channel region further includes a second region connected between said first channel region and said first diffusion region and a third region connected between said first channel region and said second diffusion region. In this case, the first channel region preferably has a dopant concentration higher than those of said second and third channel regions.

In another aspect of the present invention, a split gate nonvolatile memory cell is provided with a first diffusion region, a second diffusion region; and a channel region. The channel region includes a first channel region having a first dopant concentration, a second channel region having a second dopant concentration, and a third channel region formed at a position where the first and second channel regions are overlapped.

In still another aspect of the present invention, a split gate nonvolatile memory cell is provided with a first diffusion region, a second diffusion region, and a channel region formed between the first and second diffusion regions. The channel region includes a first channel region, a second channel region which does not overlap the first channel region, and a third channel region which does not overlap the first and second channel regions. The third channel region has a dopant concentration different from those of the first and second channel regions.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
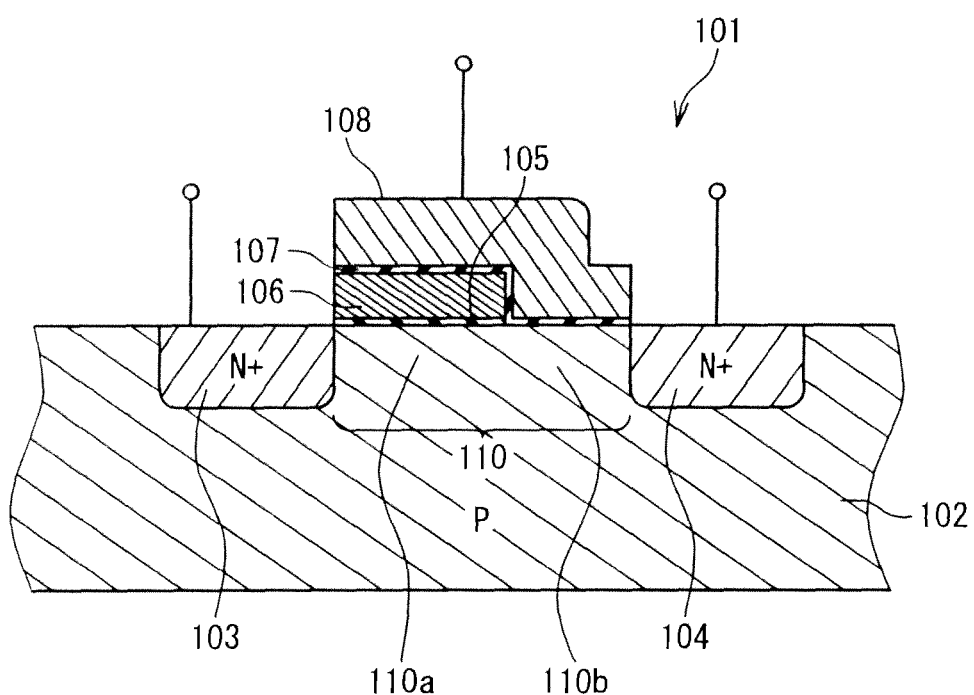
FIG. 1 illustrates the cross section structure of a conventional split gate nonvolatile memory 101.
Figure 2A:
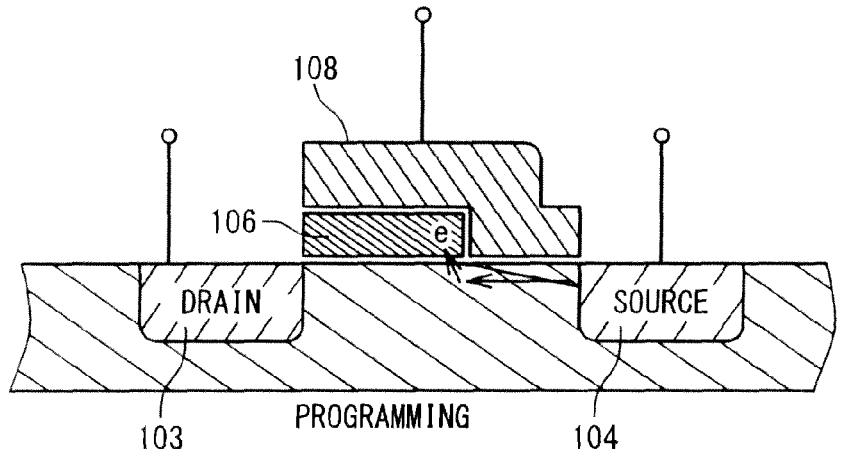
FIGS. 2A to 2C illustrate operations of the conventional split gate nonvolatile memory 101.
Figure 2B:
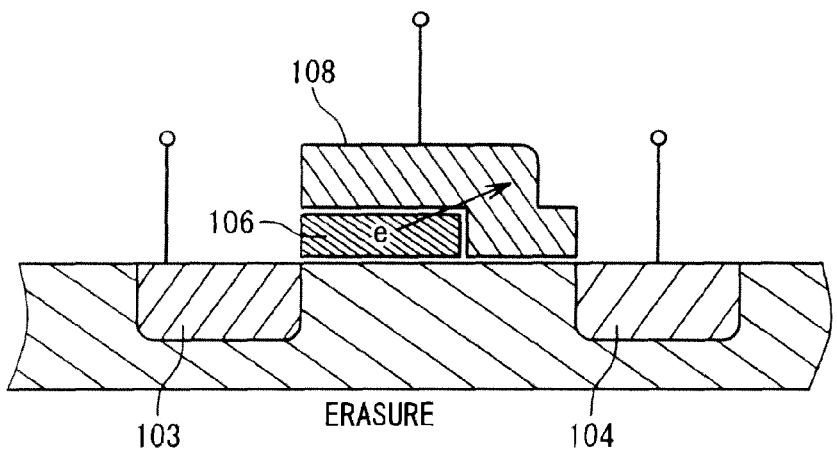
Figure 2C:
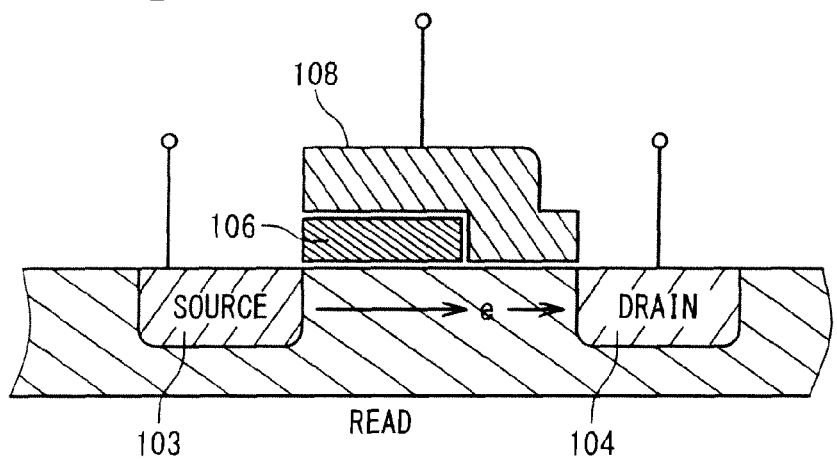
Figure 3A:
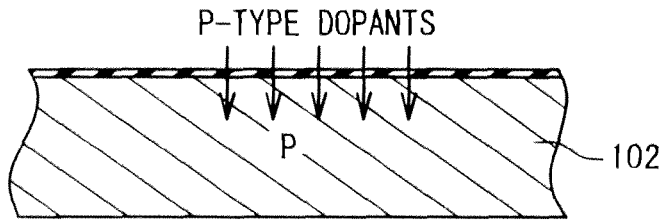
FIGS. 3A to 3D are section views illustrating the manufacture process of the conventional split gate nonvolatile memory 101.
Figure 3B:
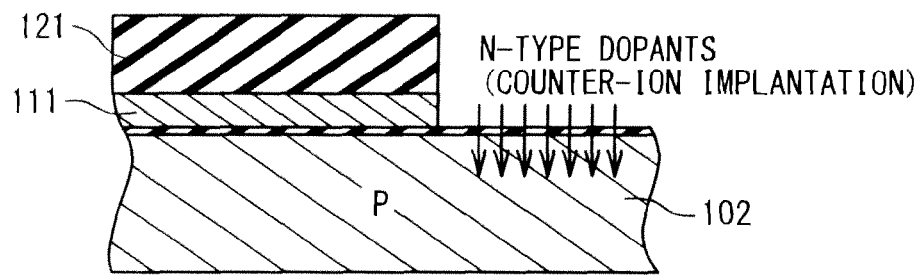
Figure 3C:
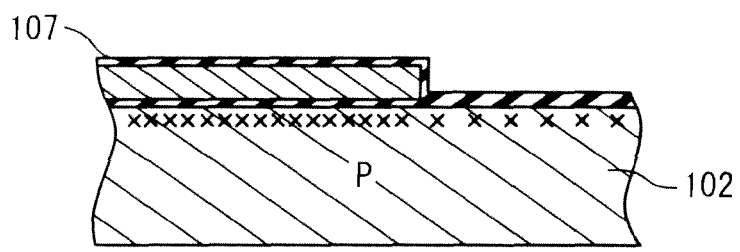
Figure 3D:
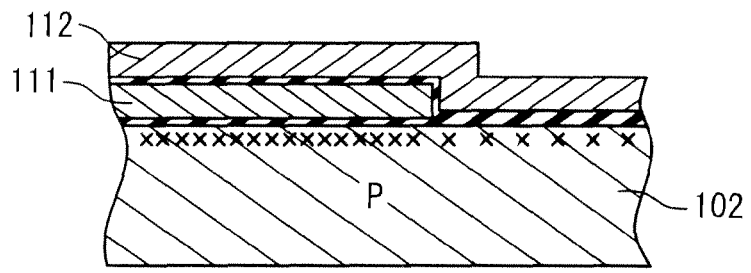
Figure 4:
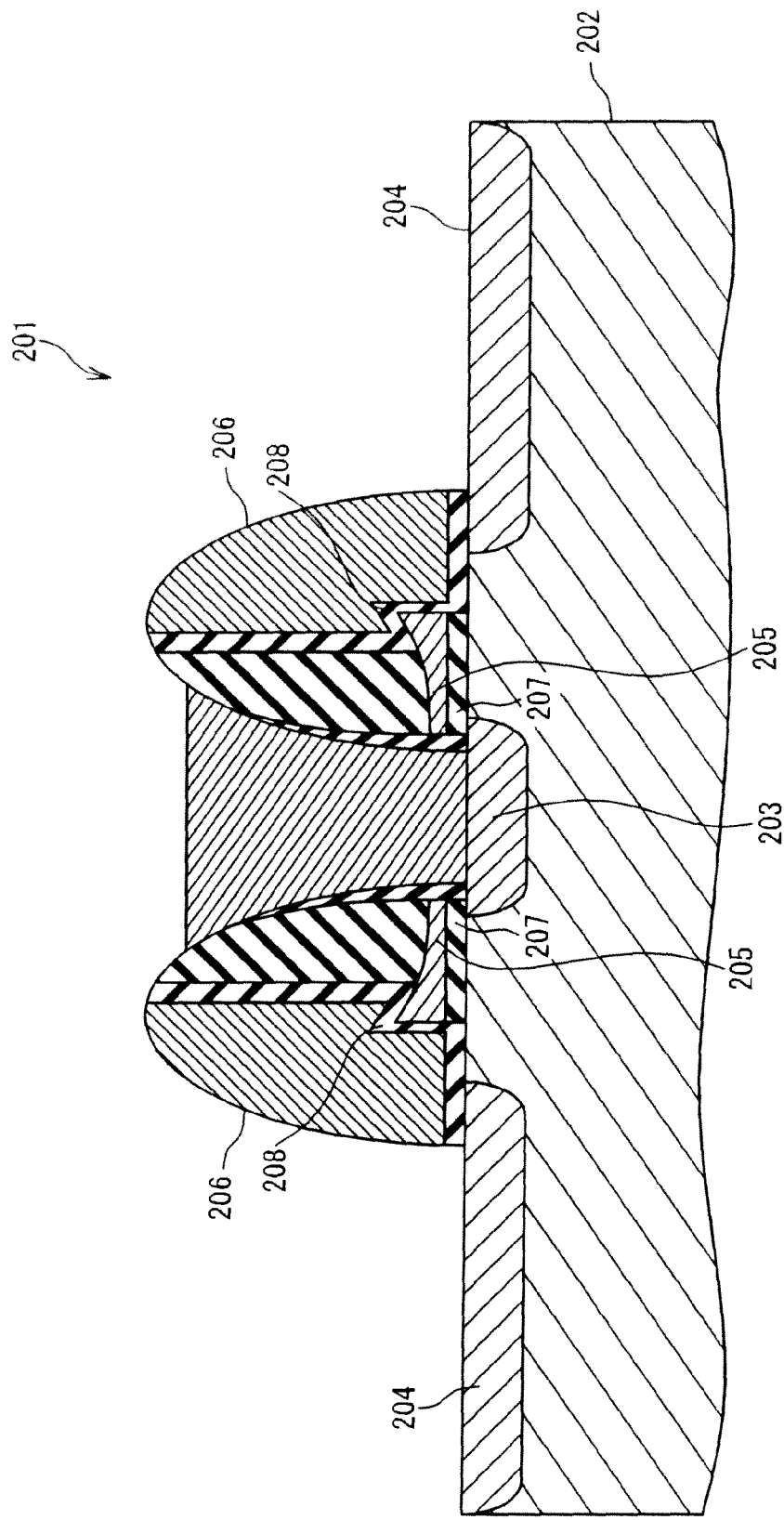
FIG. 4 illustrates the cross section structure of another conventional split gate nonvolatile memory 201.
Figure 5:
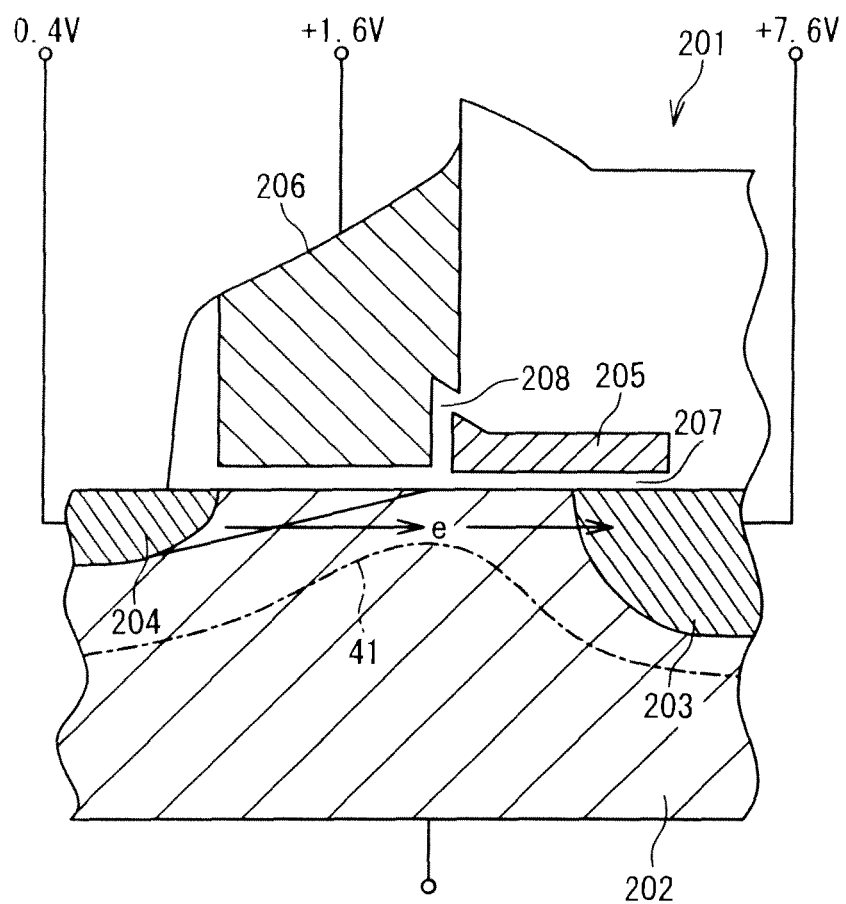
FIG. 5 illustrates operations of the conventional split gate nonvolatile memory 201.
Figure 6:
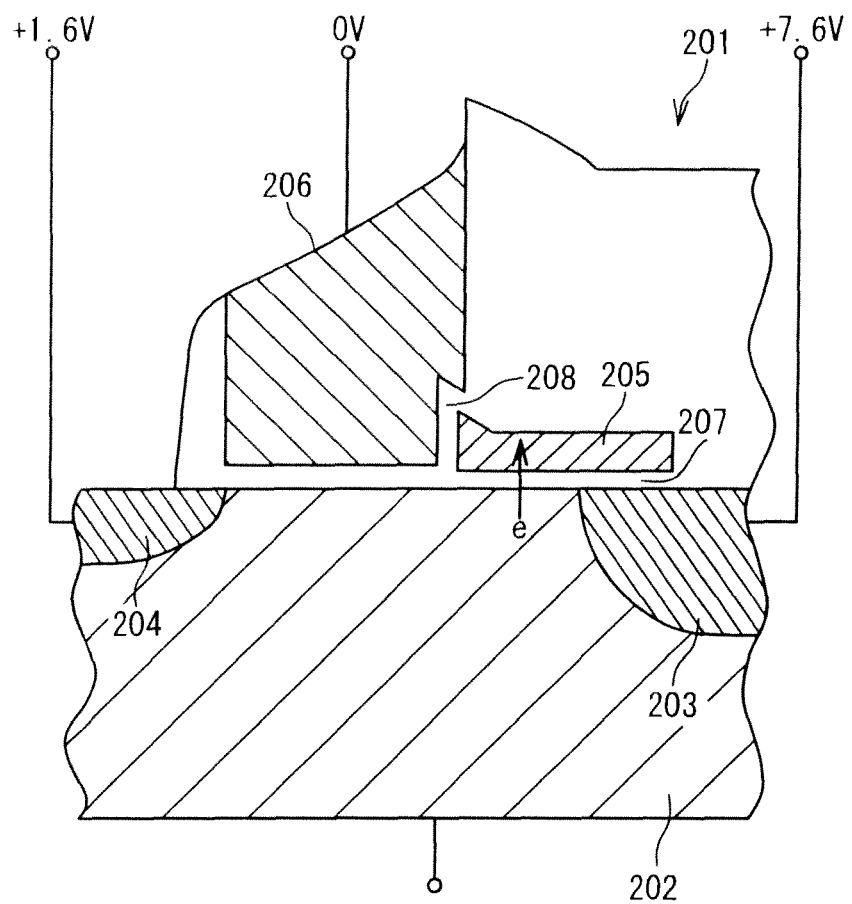
FIG. 6 illustrates operations of the conventional split gate nonvolatile memory 201.
Figure 7:
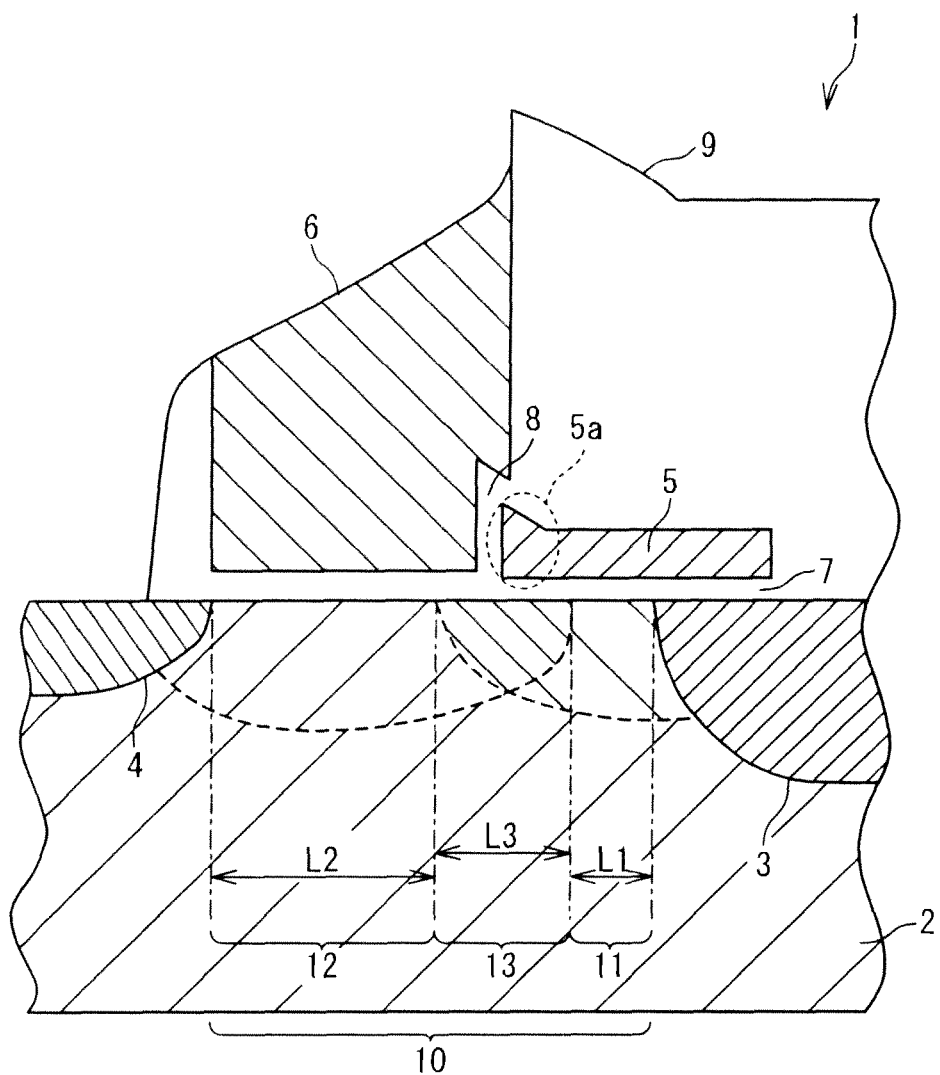
FIG. 7 illustrates the cross section structure of a split gate memory cell according to a first embodiment of the present invention.

FIG. 7 is a section view showing an exemplary structure of a split gate memory cell 1 according to a first embodiment of the present embodiment. It should be noted that FIG. 7 schematically illustrates the structure of the split gate memory cell 1 for easy understanding of the present invention. Data programming into the split gate memory cell 1 is achieved by injecting channel hot electrons generated in the substrate into the floating gate. The data erasure from the split gate memory cell 1 is achieved by pulling electrons from the floating gate to the control gate. Those skilled in the art would appreciate that the data erasure may be achieved in a different way. The state of the split gate memory cell 1 is detected by applying a reading voltage to the control gate.

The split gate memory cell 1 includes first and second diffusion regions 3 and 4 formed within a substrate 2. The diffusion regions 3 and 4 are regions which are doped with dopants. The first diffusion region 3 is used as a drain in program operation and used as a source in read operation. On the other hand, the second diffusion region 4 is used as a source in program operation and used as a drain when in read operation. In this embodiment, a P type semiconductor substrate is used as the substrate 2. Those skilled in the art would appreciate that the substrate 2 is not limited to the P type semiconductor substrate in the present invention. The split gate memory cell 1 is configured by including a channel region 10 between the first diffusion region 3 and the second diffusion region 4.

The split gate memory cell 1 additionally includes a floating gate 5 and a control gate 6. The floating gate 5 is opposed to the substrate 2 across a gate insulation film 7, and the control gate 6 is opposed to the substrate 2 across a tunnel oxide film 8. The floating gate 5 and the control gate 6 are positioned adjacent to each other and opposed to each other across the tunnel oxide film 8. An insulation film 9 is formed on the floating gate 5. The floating gate 5 is electrically insulated from other conductive elements by the gate insulation film 7, the tunnel oxide film 8, and the insulation film 9.

The channel region 10 of the split gate memory cell 1 includes first to third channel regions 11 to 13. The first channel region 11 is a part of the channel region 10 which is adjacent to the first diffusion region 3. The first channel region 11 has a length of L1 in the gate-length direction. The second channel region 12 is another part of the channel region 10 which is adjacent to the second diffusion region 4. The second channel region 12 has a length of L2 in the gate-length direction. The third channel region 13 is still another part of the channel region 10 which is positioned between the first and second channel regions 11 and 12. In this embodiment, the dopant concentration of the third channel region 13 higher than those of the first and second channel regions 11 and 12.

In this embodiment, the third channel region 13, which has a higher dopant concentration than those of the first and second channel regions 11 and 12, suppresses the increase in the thicknesses of the source-side and drain-side depletion layers and effectively avoids punch through between the source and drain.

Figure 8A:
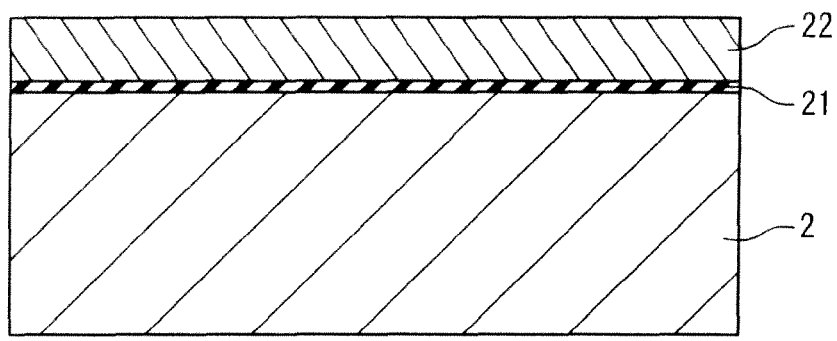
FIGS. 8A to 8P are cross section views illustrating an exemplary manufacture process of the split gate memory cell 1 according to the first embodiment.

A description is given of an exemplary manufacture process of the split gate memory cell 1 according to the first embodiment in the following. FIGS. 8A to 8P are section views illustrating an exemplary manufacture process of the split gate memory cell 1 of the present embodiment. It should be noted that two memory cells arranged in mirror symmetry are illustrated in FIGS. 8A to 8P.

As shown in FIG. 8A, the manufacture process begins with forming an initial insulation film 21 is formed on the substrate 2. It should be noted that the initial insulation film 21 is finally used as the gate insulation film 7. A first polysilicon film 22 is then formed on the initial insulation film 21. It should be noted that the polysilicon film 22 is finally processed into the floating gate 5 in the following process.

Figure 8B:
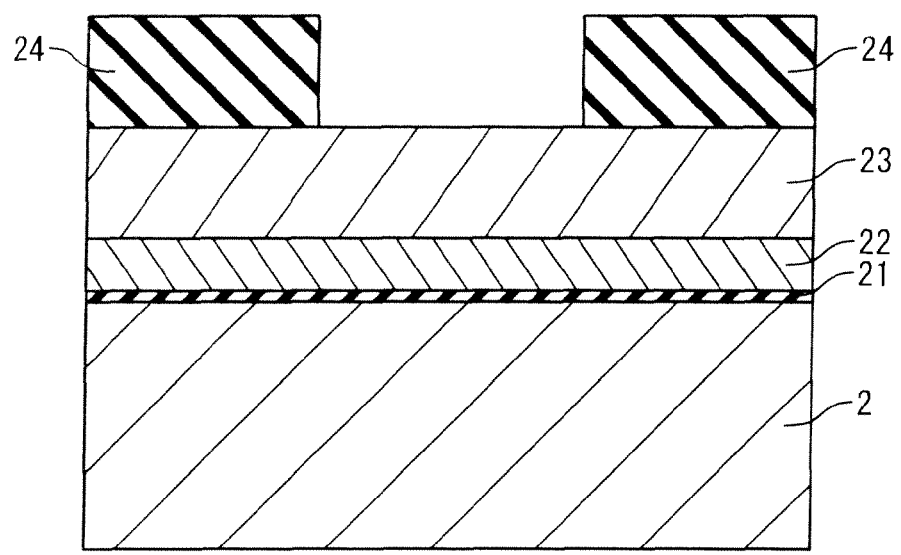

Referring to FIG. 8B, a silicon nitride film 23 is then formed on the first polysilicon film 22. This is followed by forming a resist pattern 24 on the nitride film 23.

Figure 8C:
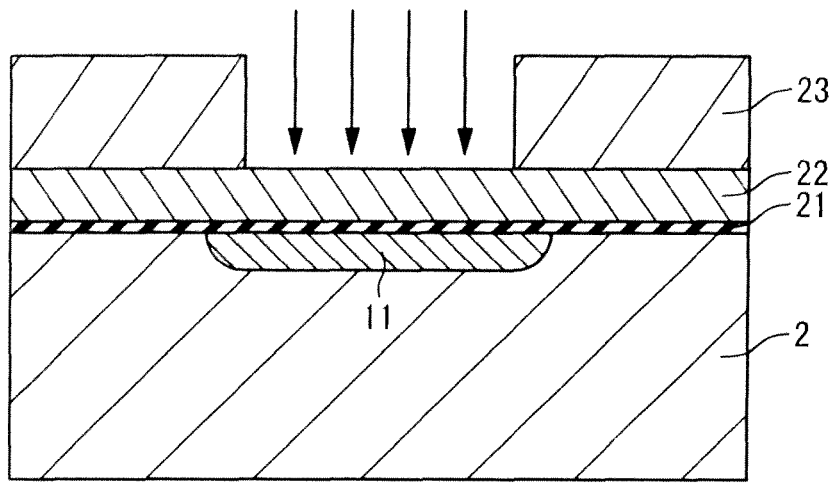

Referring to FIG. 8C, the nitride film 23 is patterned with the resist pattern 24 used as a mask. After the patterning of the nitride film 23, dopants (such as boron) are implanted to form the first channel region 11 with the patterned nitride film 23 used as a mask. The threshold voltage of the memory transistor, which is comprised of the floating gate 5 and the first channel region 11 in the split gate memory cell 1, is determined by the dopant concentration of the first channel region 11. It should be noted that the portion of the polysilicon film 22 exposed by the patterning of the nitride film 23 is finally processed into the floating gate 5 in the following process. The implantation of the dopants into the substrate 2 is implemented so that the dopant concentration of the first channel region 11 is adjusted to achieve a desired threshold voltage.

As shown FIG. 8C, the implanted dopants are diffused to a portion of the substrate 2 under the nitride film 23 used as a mask. The implantation angle and energy are preferably adjusted so that the dopants are diffused to a desired range of the substrate 2. In order to form the third channel region 13 with a desired length, it is preferable that the species of implanted dopants is selected so that a desired dopant diffusion length is obtained. In one embodiment, the split gate memory cell 1 may be subjected to annealing to widely spread the implanted dopants, after the dopant implantation.

Figure 8D:
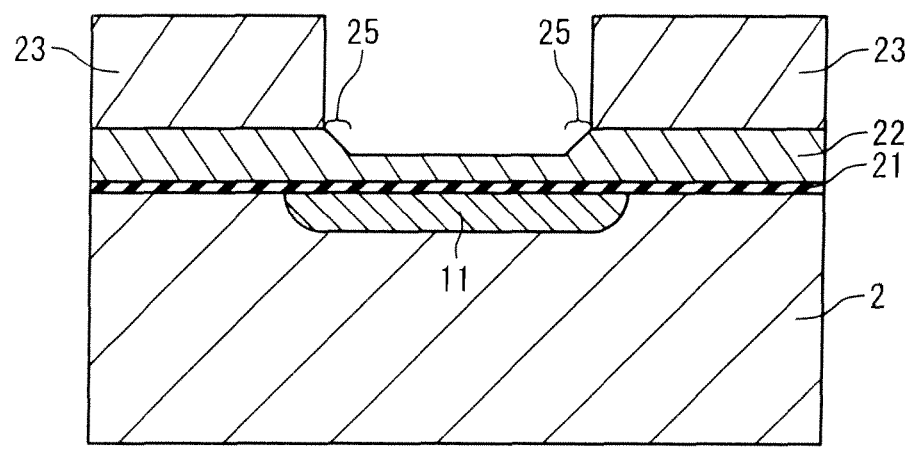
Figure 8E:
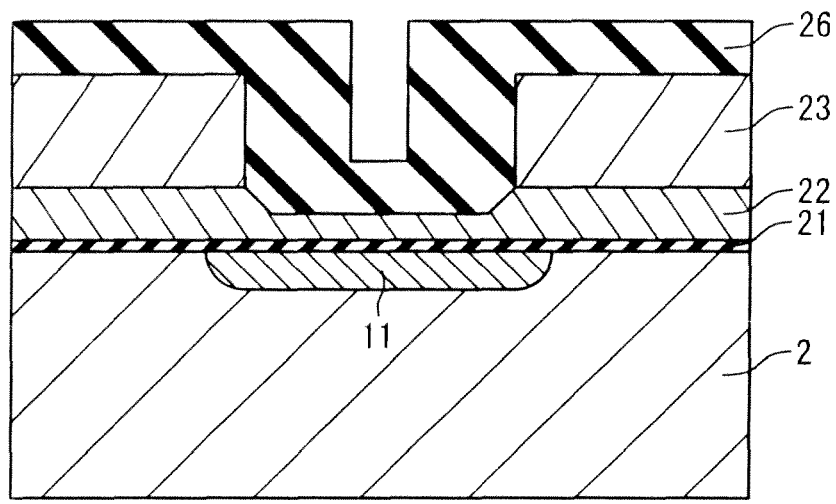
Figure 8F:
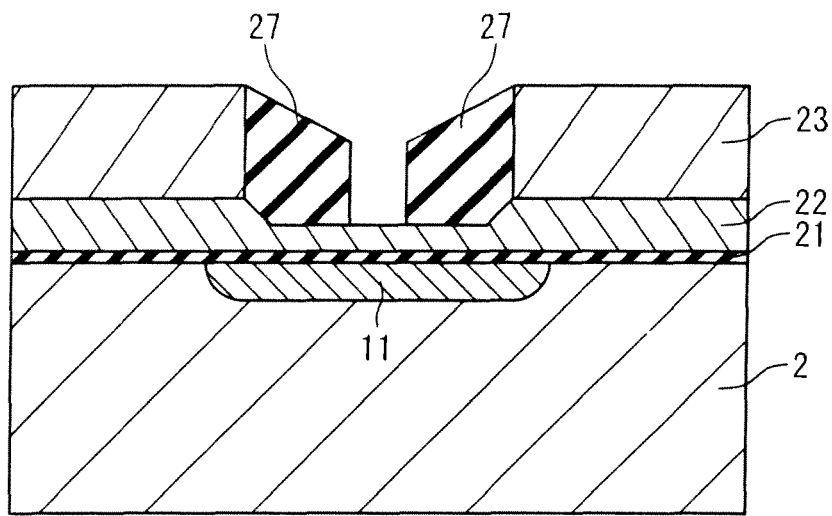

As shown in FIG. 8D, in the fourth manufacturing step, slope structures 25 are formed by etching. The slope structures 25 are finally processed into tip parts 5a of the floating gates 5 in the following processes. As shown in FIG. 8E, this is followed by depositing an oxide film 26 to cover the entire structure. As shown in FIG. 8F, the oxide film 26 is then etched back to form spacers 27 on the side of the nitride film 23.

Figure 8G:
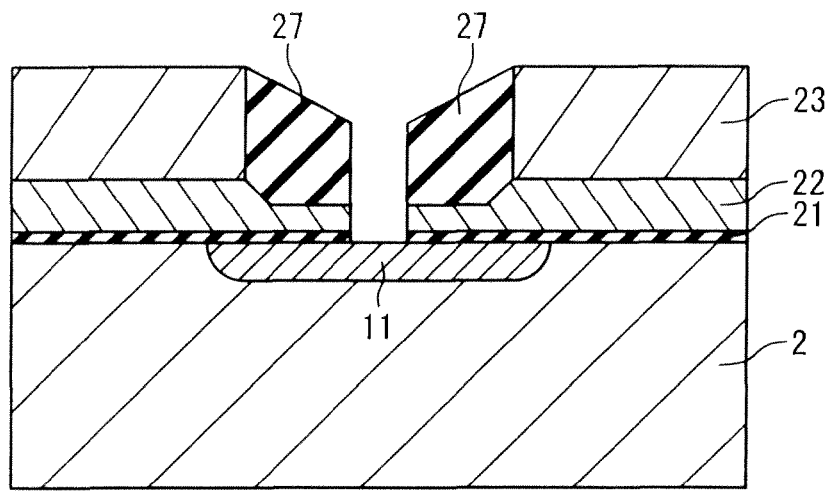

Subsequently, as shown in FIG. 8G, the first polysilicon film 22 and the initial insulation film 21 are etched with the spacers 27 and the nitride film 23 used as masks. As shown in FIG. 8G, the exposed portions of the polysilicon film 22 and the initial insulation film 21 are removed by this etching, and a region of the substrate 2 corresponding to the source of the split gate memory cell 1 is exposed consequently.

Figure 8H:
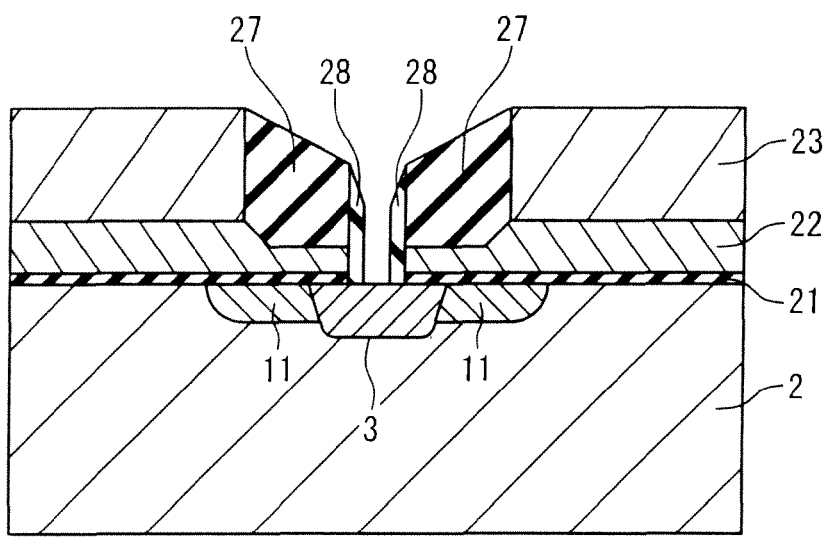

As shown in FIG. 8H, dopants are then implanted with the spacers 27 used as a mask in order to form the first diffusion region 3. The diffusion region formed by this dopant implantation is used as the first diffusion region 3 of the split gate memory cell 1. After the formation of the first diffusion region 3, as shown in FIG. 8H, sidewalls 28 of silicon oxide are formed on the side of the spacers 27.

Figure 8I:
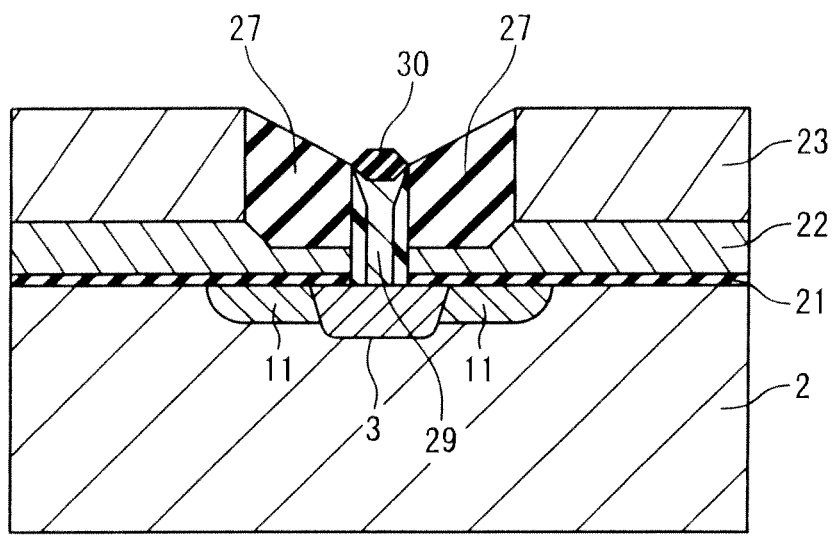

Referring to FIG. 8I, a source line 29 is then formed on the first diffusion region 3 to fill the contact hole reaching the first diffusion region 3. After the formation of the source line 29, a source line oxide film 30 is then formed on the source line 29.

Figure 8J:
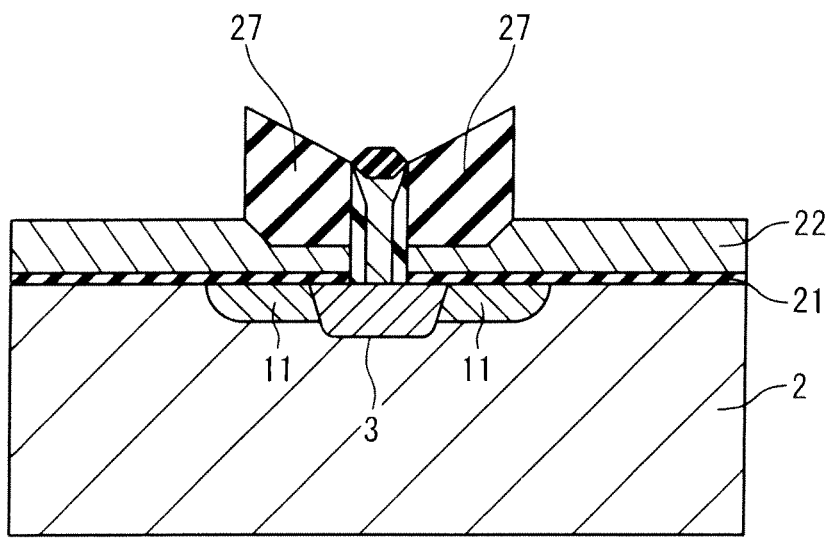

This is followed by removing the nitride film 23 by etching as shown in FIG. 8J to expose the surface of the first polysilicon film 22. Only the spacers 27 remain on the first polysilicon film 22 after the removal of the nitride film 23.

Figure 8K:
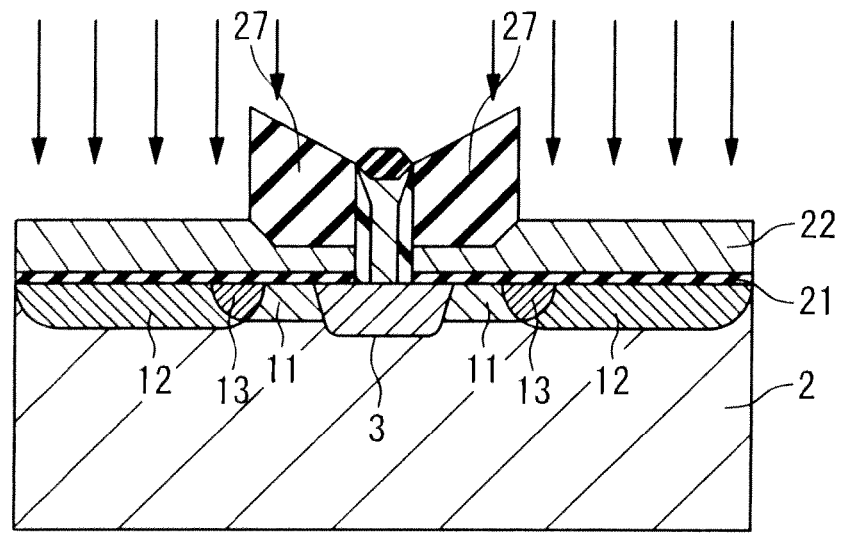

As shown in FIG. 8K, dopants (for example, Boron) are then implanted to form the second channel region 12. The dopants are implanted with the spacers 27 used as masks, only into the regions to be positioned under the control gate 6. In this implantation, the dopants are implanted so that the dopant concentration of the second channel region 12 is same as that of the first channel region 11. Specifically, the dopants are implanted through the exposed first polysilicon film 22 with an energy allowing the dopants to diffuse into the surface portion of the substrate 2.

It should be noted that some of the implanted dopants are laterally diffused into the regions under the spacers 27 along the in-plane direction of the substrate 2, when the spacers 27 are used as masks. Accordingly, as shown in FIG. 8K, the third channel region 13 is simultaneously formed in the manufacture step of forming the second channel region 12 at the position where first and second channel regions 11 and 12 are overlapped. The third channel region 13 can be formed to have a desired width by controlling the energy and angle of the dopant implantation and by using an appropriate dopant species in the dopant implantations, depending on a desired diffusion length. In one embodiment, an annealing treatment may be implemented after the dopant implantation to control the width of the width of the third channel region 13.

Figure 8L:
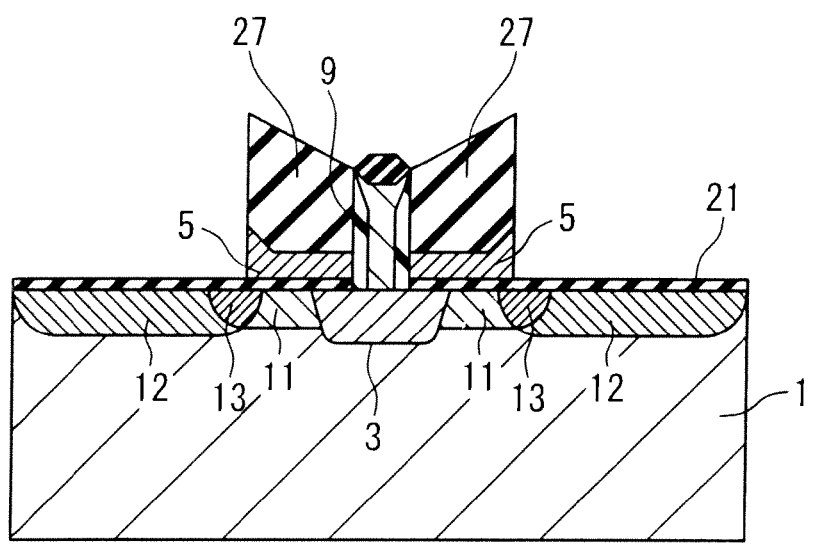
Figure 8M:
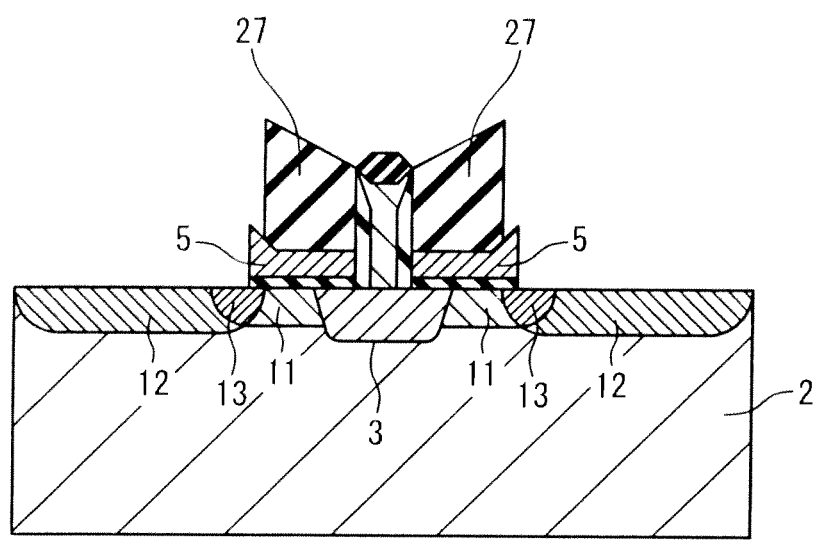

After the formation of the second channel region 12 (and the simultaneous formation of the third channel region 13), as shown in FIG. 8L, the polysilicon film 22 is etched with the spacers 27 used as masks to form the floating gates 5. After this etching, the surface of the initial insulation film 21 is partially exposed. As shown in FIG. 8M, this is followed by etching the exposed portion of the initial insulation film 21 with the spacers 27 and the first poly silicon film 22 used as masks. By this etching, the initial insulation film 21 is partially removed to form the gate oxide films under the floating gates 5. As shown in FIG. 8M, the side surface portions of the spacers 27 are also removed by this etching.

Figure 8N:
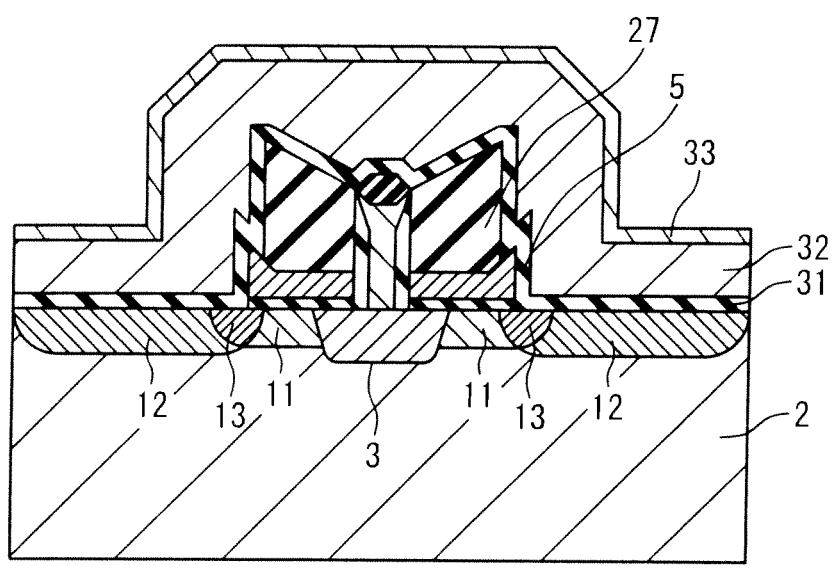

As shown in FIG. 8N, an oxide film 31 is then formed to entirely cover the substrate 2. The floating gate 5, the spacers 27, and the source line oxide film 30 are covered with the oxide film 31. It should be noted that the oxide film 31 is finally processed into the tunnel oxide film 8. After the formation of the oxide film 31, a cell gate polysilicon film 32 is formed on the oxide film 31. The cell gate polysilicon film 32 is processed into the control gate 6 in a subsequent manufacture process. Furthermore, a nitride film 33 is then formed on the cell gate polysilicon film 32.

Figure 8O:
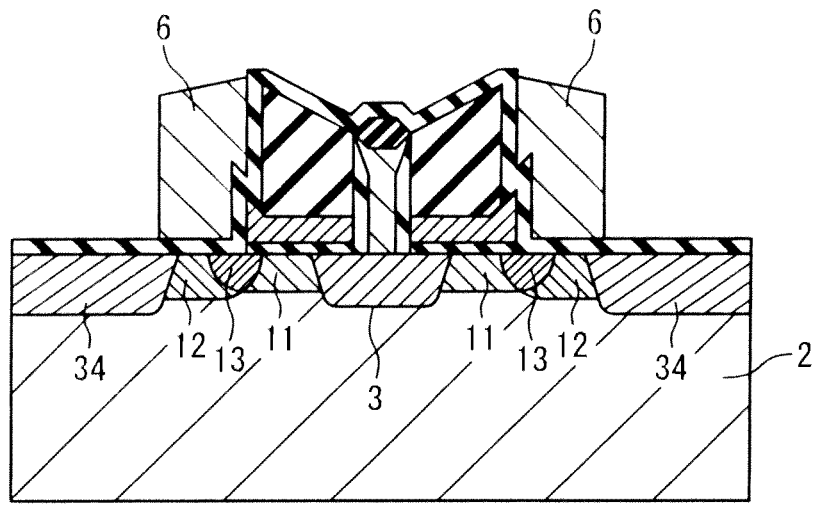
Figure 8P:
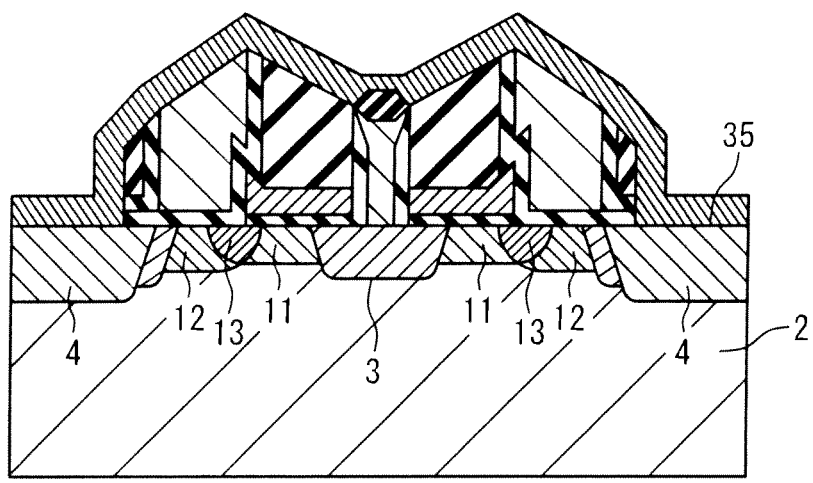

As shown in FIG. 8O, this is followed by etching the nitride film 33 and the cell gate polysilicon film 32 to form the control gates 6 on the side of the film stack formed of the floating gates 5, the spacers 27 and the oxide film 31. After the formation of the control gates 6, dopants are implanted with the control gates 6 as masks in order to form LDD (Lightly Doped Drain) regions 34. Referring to FIG. 8P, sidewalls are formed on side surfaces of the control gates 6. This is followed by implanting dopants with the control gates 6 and the sidewalls thereof used as masks, to thereby form the second diffusion region 4. After the formation of the second diffusion region 4, a nitride film 35 is formed to cover the entire structure. This completes the formation of the split gate memory cells 1 in this embodiment. The first channel region 11, the second channel region 12, and the third channel region 13 of the split gate memory cell 1 are formed through the above-mentioned steps in this embodiment.

Figure 9:
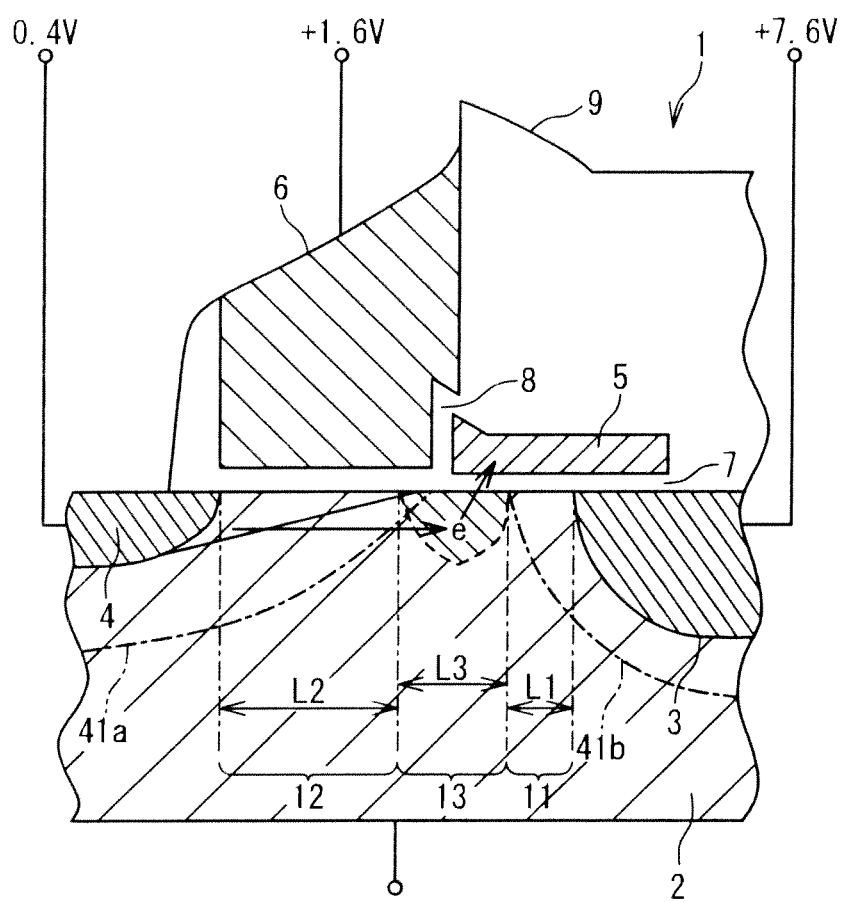
FIG. 9 is a section view illustrating an advantage of the split gate memory cell 1 according to the first embodiment.

An exemplary program operation in the split gate memory cell 1 of the present embodiment will be described below. FIG. 9 is a cross section view illustrating of the state of the split gate memory cell 1 in program operation in this embodiment.

The punch through is effectively avoided in the split gate memory cell 1 according to this embodiment, even when a floating gate length is shortened to achieve cell size reduction. As shown in FIG. 9, in program operation of the split gate memory cell 1, a high voltage is applied to the first diffusion region 3. In this case, the source-side depletion layer 41a is expanded by the reverse bias between the substrate 2 and the first diffusion region 3. It should be noted that the third channel region 13 has a higher dopant concentration than those of the first channel region 11 and the second channel region 12 as described above. Due to the higher dopant concentration of the third channel region 13, the expansion of the source depletion layer 41a into the third channel region 13 is suppressed even when the floating gate length is shortened.

As thus described, the split gate memory cell 1 according to this embodiment is designed so that the connection between the source-side depletion layer 41a and the drain-side depletion layer 41b is effectively avoided by the third channel region 13 in program operation in which a high intensity electric field is applied between the source and the drain. For this reason, channel hot electrons are generated in the third channel region 13, which is the portion of the substrate 2 opposed to the spacing between the floating gate 5 and the control gate 6, and the generated hot electrons are injected into the floating gate 5, even when the floating gate length is shortened. Accordingly, the split gate memory cell 1 successfully achieves program operation in this embodiment for a shortened floating gate length.

Second Embodiment

A description is given of a second embodiment of the present invention in the following, with reference to FIGS. 10A to FIG. 10I. It should be noted that the same elements are denoted by the same reference numerals in the attached drawings, and detail descriptions thereof may be omitted in the following.

In the second embodiment, the present invention is applied to a split gate memory cell having a shape different from that of the first embodiment. FIGS. 10A to 10I illustrate an exemplary manufacture process of the split gate memory cell 1 according to the second embodiment.

Figure 10A:
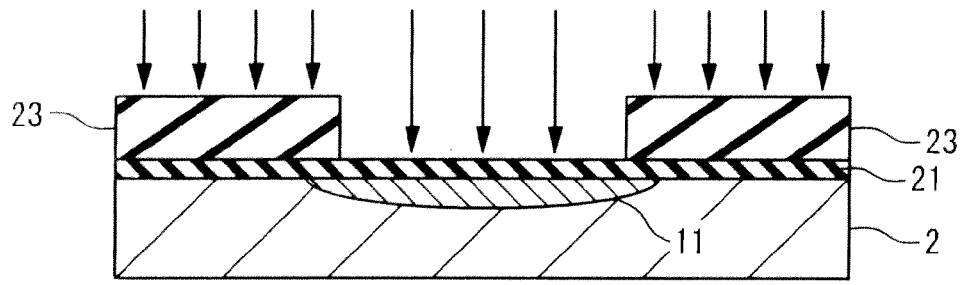
FIGS. 10A to 10I are section views illustrating an exemplary manufacture process of the split gate memory cell 1 according to a second embodiment.

Referring to FIG. 10A, the manufacture process of the split gate memory cell 1 according to the second embodiment begins with forming an initial insulation film 21 on the substrate 2, and a nitride film 23 is then formed on the initial insulation film 21. This is followed by forming a resist pattern (not shown in FIG. 10A) on the nitride film 23. The nitride film 23 is then patterned by using the resist pattern. After the etching of the nitride film 23, dopants (for example, boron) are implanted to form the first channel region 11 with the patterned nitride film 23 used as a mask.

Figure 10B:
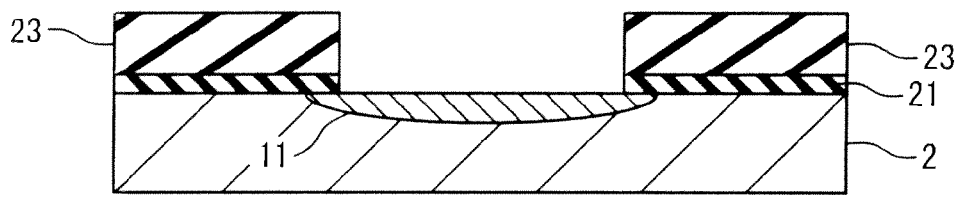
Figure 10C:
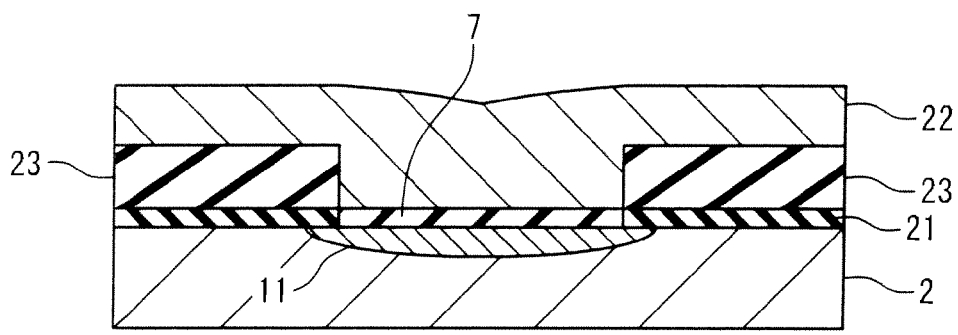
Figure 10D:
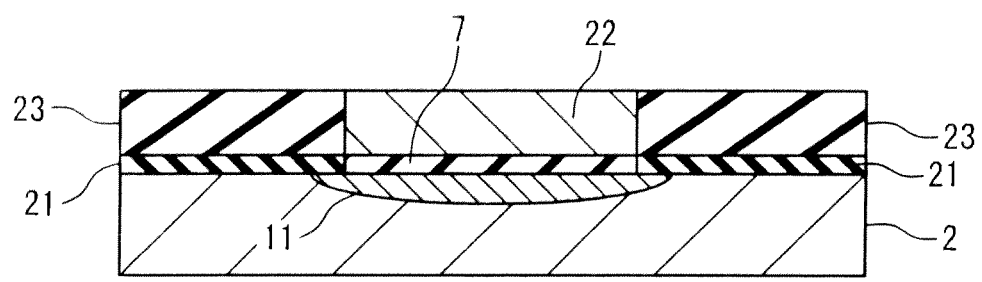

As shown in FIG. 10B, the exposed portion of the initial insulation film 21 is then removed with the nitride film 23 used as a mask. This results in that the upper surface of the first channel region 11 in the substrate 2 is partially exposed. Referring to FIG. 10C, the gate insulation film 7 is formed on the exposed portion of the first channel region 11. After the formation of the gate insulation film 7, a first polysilicon film 22 is formed on the gate insulation film 7 and the nitride film 23. As shown in FIG. 10D, the first polysilicon film 22 is subjected to flattening by using a known flattening technique, such as a CMP (chemical mechanical polishing) technique after the formation of the first polysilicon film 22.

Figure 10E:
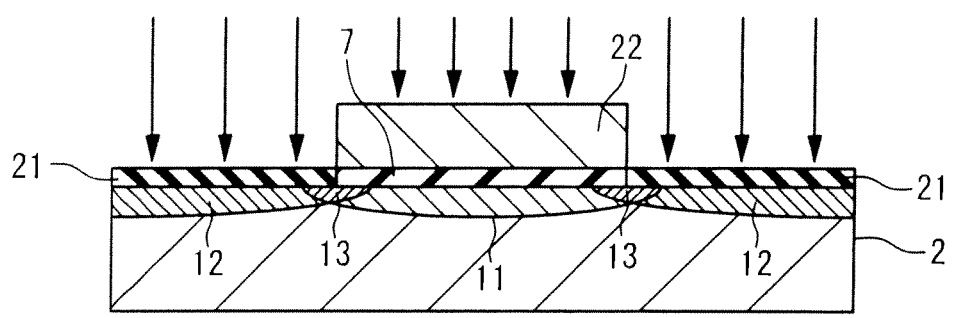

The nitride film 23 is then removed as shown in FIG. 10E. After the removal of the nitride film 23, dopants are implanted to form the second channel region 12 with the first polysilicon film 22 used as a mask. The dopants are implanted into the region of the substrate 2 other than the region positioned under the first polysilicon film 22. In this implantation, the dopants are implanted so that the dopant concentration of the second channel region 12 is controlled to be same as that of the first channel region 11. Specifically, the implantation is implemented through the exposed region of the first polysilicon film 22 with an energy allowing the dopants to be diffused into the surface portion of the substrate 2. It should be noted that some of the dopants implanted laterally diffuses into the region under the first polysilicon film 22 in the in-plane direction of the substrate 2, when the first polysilicon film 22 is used as a mask. Accordingly, as shown in FIG. 10E, the third channel region 13 is formed simultaneously with the formation of the second channel region 12.

Figure 10F:
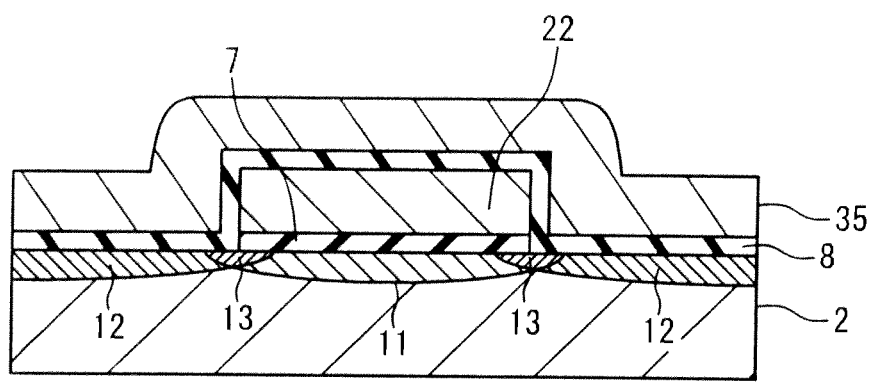

After the removal of the initial insulation film 21, as shown in FIG. 10F, a tunnel oxide film 8 is formed. This is followed by forming a second polysilicon film 35 on the tunnel oxide film 8.

Figure 10G:
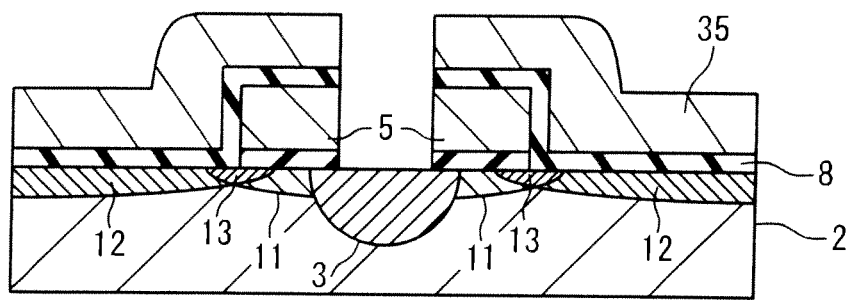

As shown in FIG. 10G, the second polysilicon film 35, the tunnel oxide film 8, the first polysilicon film 22 and the gate insulation film 7 are patterned to form an opening exposing a portion of the substrate 2. The opening is used for forming the first diffusion layer 3 within the substrate 2. After the formation of the opening, dopants are implanted to from the first diffusion region 3, using the second polysilicon film 35, the tunnel oxide film 8, the first polysilicon film 22 and the gate insulation film 7 as a mask.

Figure 10H:
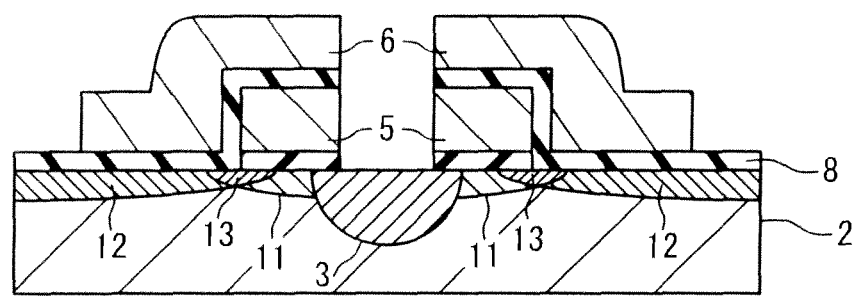
Figure 10I:
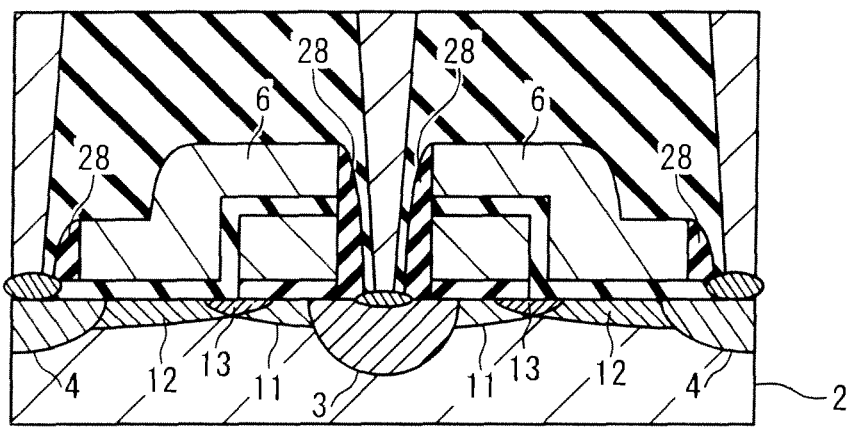

Referring to FIG. 10H, the second polysilicon film 35 is then patterned to form control gates 6. After sidewalls 28 are then formed on the sides of the control gates 6, as shown in FIG. 10I, dopants are into the substrate 2 in order to form the second diffusion region 4. After the formation of the second diffusion region 4, the entire structure is covered with an interlayer dielectric, and contacts reaching the first and second diffusion regions 3 and 4 are formed through the interlayer dielectric.

In the second embodiment, as is the case of the first embodiment, the third channel region 13 is formed to have a desired width can be formed by controlling the energy and angle of the dopant implantation and/or by selecting an appropriate dopant species, depending on a desired diffusion length of the dopants. In one embodiment, an annealing treatment may be implemented to control the width of the third channel region 13 after the dopant implantation.

The split gate memory cell 1 formed by the aforementioned process according to the second embodiment effectively avoids punch-through due to the increased dopant concentration of the third channel region 13, as is the case of the split gate memory cell 1 according to the first embodiment. As a result, the problem that the drain current may be uncontrollable by the gate voltage due to the punch through is avoided, even when a gate length is shortened to minimize the memory cell size.

In summary, in a preferred embodiment, a manufacture method for manufacturing a nonvolatile memory cell including a control gate and a floating gate includes:

forming a first mask having an opening exposing a region in which the floating gate is to be formed;

diffusing first impurities into a semiconductor substrate through the opening;

forming a second mask in the opening;

diffusing second impurities into a portion of the semiconductor substrate to be positioned under the control gate, the portion being uncovered with the second mask; and forming the floating gate and the control gate through etching polysilicon films formed over the semiconductor substrate.

Preferably, the first dopants are preferably implanted with such a dopant concentration that a hot electron effect is suppressed under the floating gate, and the second dopants are implanted with such a dopant concentration that a hot electron effect is suppressed under the control gate.

It is also preferable that the first dopants are diffused into a portion of the semiconductor substrate under the first mask, and the second dopants are diffused into a portion of the semiconductor substrate under the second mask to thereby form a channel region including the first and second dopants.

It is also preferable that the manufacture method further includes: implementing an annealing after the first and second dopants are diffused.

In another embodiment, a manufacture method of a split gate nonvolatile memory cell including a floating gate and a control gate, comprising:

forming a polysilicon film to cover a semiconductor substrate across a first insulating film;

forming a second insulating film on the polysilicon film;

etching the second insulating film to form a first opening exposing a portion of the polysilicon film to be processed into the floating gate;

etching the polysilicon film to form a slope adjacent to a side of the first opening;

diffusing first dopants into the semiconductor substrate through the first opening;

forming a third insulating film to cover the second insulating film and the first opening;

etching back the third insulating film to form a spacer on a side of the first opening;

removing the second insulating film to form a second opening;

diffusing second dopants into a portion of the semiconductor film through the second opening;

etching a portion of the polysilicon film exposed by the second opening to form the floating gate; and forming the control gate so that the control gate is opposed to the floating gate and the semiconductor substrate.

Preferably the first dopants are diffused with such a dopant concentration that a hot electron effect is suppressed under the floating gate, and the second dopants are diffused with such a dopant concentration that a hot electron effect is suppressed under the control gate. In this case, it is further preferable that the first dopants are diffused under the second insulating film, and the second dopants are diffused under the spacer to automatically form a channel region including first and second dopants. It is also preferable that the manufacture method further includes: implementing an annealing after the first and second dopants are diffused.

In still another embodiment, a manufacture method of a split gate nonvolatile memory cell includes:

forming a first insulating film on a semiconductor substrate;

forming a second insulating film having a first opening on the first insulating film;

diffusing first impurities into a portion of the semiconductor substrate through the first opening;

forming a first polysilicon film to fill the first opening;

removing the second insulating film to form a second opening;

diffusing second impurities into a portion of the semiconductor substrate through the second opening;

forming a second polysilicon film to cover the second opening and the first polysilicon film, and patterning the first and second polysilicon films to form a floating gate and a control gate.

Preferably, the first dopants are diffused with such a dopant concentration that a hot electron effect is suppressed under the floating gate, and wherein the second dopants are diffused with such a dopant concentration that a hot electron effect is suppressed under the control gate.

Preferably, the first dopants are diffused under the second insulating film, and the second dopants are diffused under the first polysilicon film to automatically form a channel region including the first and second dopants. It is also preferable that the manufacture method further includes: implementing an annealing after the first and second dopants are diffused.

It is apparent that the present invention is not limited to the above embodiments, but may be modified and changed without departing from the scope of the invention.

What is claimed is:

1. A manufacture method of a semiconductor device, said manufacture method comprising steps of:
   (a) forming a first insulating film on a semiconductor substrate;
   (b) forming a polysilicon film on said first insulating film;
   (c) implanting first dopants into said semiconductor substrate to form a first channel region after said (b) step;
   (d) etching said polysilicon film after said (c) step;
   (e) forming a first diffusion region adjacent to said first channel region after said (d) step, said first diffusion region being used as a source or a drain;
   (f) implanting second dopants of the same conductive type as said first dopants into a portion of said semiconductor substrate after said (e) step to form a second channel region including said second dopants and a third channel region positioned between said first and second channel regions and including said first and second dopants, said portion of semiconductor substrate partially overlapping said first channel region, and said third channel region having a higher impurity concentration than those of said first and second channel regions;
   (g) etching said polysilicon film after said (f) step to form a floating gate which is formed as a portion of said polysilicon film;
   (h) forming a control gate positioned adjacent to said floating gate across a second insulating film after said (g) step; and
   (i) after said (h) step, forming a second diffusion region which is used as a drain or a source in a region adjacent to said second channel region, so that said second channel region is positioned between said third channel region and said second diffusion region.

2. The manufacture method according to claim 1, wherein said (d) step includes forming an opening by etching a portion of said polysilicon film overlapping said first channel region, and wherein said (e) step includes implanting third dopants having a conductivity type different from that of said first dopants.

3. A manufacture method of a nonvolatile memory cell including a control gate and a floating gate, said manufacture method comprising steps of:
- forming a first mask having an opening exposing a region in which said floating gate is to be formed;
- diffusing first dopants into a semiconductor substrate through said opening;
- forming a second mask in said opening;
- diffusing second dopants into a portion of said semiconductor substrate to be positioned under said control gate, said portion being uncovered with said second mask; and
- forming said floating gate and said control gate through etching polysilicon films formed over said semiconductor substrate,
- wherein said first dopants are implanted with such a dopant concentration that a hot electron effect is suppressed under said floating gate, and
- wherein said second dopants are implanted with such a dopant concentration that a hot electron effect is suppressed under said control gate, and
- wherein said first dopants are diffused into a portion of said semiconductor substrate under said first mask, and
- wherein said second dopants are diffused into a portion of said semiconductor substrate under said second mask to thereby form a channel region including said first and said second dopants.

4. The manufacture method according to claim 3, further comprising:
- implementing an annealing after said first and second dopants are diffused.

5. A manufacture method of a split gate nonvolatile memory cell including a floating gate and a control gate, said method comprising:
- forming a polysilicon film to cover a semiconductor substrate across a first insulating film;
- forming a second insulating film on said polysilicon film;
- etching said second insulating film to form a first opening exposing a portion of said polysilicon film to be processed into said floating gate;
- etching said polysilicon film to form a slope adjacent to a side of said first opening;
- diffusing first dopants into said semiconductor substrate through said first opening;
- forming a third insulating film to cover said second insulating film and said first opening;
- etching back said third insulating film to form a spacer on a side of said first opening;
- removing said second insulating film to form a second opening;
- diffusing second dopants into a portion of said semiconductor film through said second opening;
- etching a portion of said polysilicon film exposed by said second opening to form said floating gate; and
- forming said control gate so that said control gate is opposed to said floating gate and said semiconductor substrate,
- wherein first dopants are diffused with such a dopant concentration that a hot electron effect is suppressed under said floating gate, wherein second dopants are diffused with such a dopant concentration that a hot electron effect is suppressed under said control gate,
- wherein said first dopants are diffused under said second insulating film, and
- wherein said second dopants are diffused under said spacer to automatically form a channel region including first and second dopants.

6. The manufacture method according to claim 5, further comprising:
- implementing an annealing after said diffusing said first and second dopants.

* * * * *